United States Patent
Chen

(10) Patent No.: US 11,537,017 B2
(45) Date of Patent: Dec. 27, 2022

(54) ARRAY SUBSTRATE AND DISPLAY PANEL

(71) Applicant: TCL CHINA STAR OPTOELECTRONICS TECHNOLOGY CO., LTD., Shenzhen (CN)

(72) Inventor: Yani Chen, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 447 days.

(21) Appl. No.: 16/758,422

(22) PCT Filed: Apr. 2, 2020

(86) PCT No.: PCT/CN2020/083008
§ 371 (c)(1),
(2) Date: Apr. 23, 2020

(87) PCT Pub. No.: WO2021/179370
PCT Pub. Date: Sep. 16, 2021

(65) Prior Publication Data
US 2022/0317526 A1    Oct. 6, 2022

(30) Foreign Application Priority Data
Mar. 12, 2020 (CN) .......................... 202010170492.4

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC ............. G02F 1/13624; H01L 27/1222; H01L 27/124; H01L 27/1255; G09G 3/3648; G09G 2300/0842
(Continued)

(56) References Cited

U.S. PATENT DOCUMENTS 9,753,343 B2    9/2017    Lim et al.
9,804,461 B2    10/2017   Shin
(Continued)

FOREIGN PATENT DOCUMENTS

CN    100423058 C    10/2008
CN    102566177 A    7/2012
(Continued)

*Primary Examiner* — Charles S Chang
(74) *Attorney, Agent, or Firm* — PV IP PC; Wei Te Chung; Ude Lu

(57) ABSTRACT

An array substrate and a display panel are provided. The array substrate includes a plurality of sub-pixels, and each sub-pixel includes four thin film transistors. The array substrate further includes a gate line, a data line, and a divided voltage line. In the present invention, a channel aspect ratio of second thin film transistor is greater than a channel aspect ratio of the first thin film transistor and a channel aspect ratio of third thin film transistor, and a drain of a fourth thin film transistor is electrically connected to the divided voltage line, such that the display panel has a wider viewing angle.

19 Claims, 2 Drawing Sheets

(51) Int. Cl.
   *G02F 1/1368* (2006.01)
   *G09G 3/36* (2006.01)
(52) U.S. Cl.
   CPC ...... *G02F 1/136213* (2013.01); *H01L 27/124* (2013.01); *H01L 27/1222* (2013.01); *H01L 27/1255* (2013.01); *G09G 3/3648* (2013.01); *G09G 2300/0842* (2013.01)
(58) Field of Classification Search
   USPC ...................................................... 349/42–48
   See application file for complete search history.

(56) References Cited

U.S. PATENT DOCUMENTS

| | | |
|---|---|---|
| 2002/0158587 A1 | 10/2002 | Komiya |
| 2009/0231505 A1 | 9/2009 | Wang et al. |
| 2010/0157232 A1 | 6/2010 | Kim et al. |
| 2013/0077002 A1 | 3/2013 | Yoon |
| 2013/0128166 A1 | 5/2013 | Chiang |
| 2015/0036067 A1 | 2/2015 | Xue |
| 2015/0248864 A1 | 9/2015 | Chen et al. |
| 2016/0178954 A1 | 6/2016 | Lim et al. |
| 2016/0202585 A1* | 7/2016 | Jung ............. G02F 1/136209 349/43 |
| 2016/0210924 A1 | 7/2016 | Yao et al. |
| 2017/0090263 A1 | 3/2017 | Jeong et al. |
| 2017/0148406 A1 | 5/2017 | Yi |
| 2017/0285427 A1 | 10/2017 | Kim et al. |
| 2018/0096663 A1 | 4/2018 | Xu |
| 2018/0157128 A1 | 6/2018 | Yao |
| 2018/0246387 A1 | 8/2018 | Jung et al. |
| 2018/0315386 A1 | 11/2018 | Gan |
| 2018/0342214 A1 | 11/2018 | Ying et al. |
| 2019/0139987 A1 | 5/2019 | Gan |
| 2020/0004069 A1 | 1/2020 | Kim et al. |
| 2020/0041829 A1 | 2/2020 | Gan et al. |

FOREIGN PATENT DOCUMENTS

| | | |
|---|---|---|
| CN | 103268043 A | 8/2013 |
| CN | 103323995 A | 9/2013 |
| CN | 103353697 A | 10/2013 |
| CN | 103488018 A | 1/2014 |
| CN | 204101858 U | 1/2015 |
| CN | 104712346 A | 6/2015 |
| CN | 104714346 A | 6/2015 |
| CN | 104751820 A | 7/2015 |
| CN | 104865763 A | 8/2015 |
| CN | 105116646 A | 12/2015 |
| CN | 105609077 A | 5/2016 |
| CN | 105785675 A | 7/2016 |
| CN | 106647075 A | 5/2017 |
| CN | 106842750 A | 6/2017 |
| CN | 106855668 A | 6/2017 |
| CN | 107643634 A | 1/2018 |
| CN | 107643639 A | 1/2018 |
| CN | 107942589 A | 4/2018 |
| CN | 107991818 A | 5/2018 |
| CN | 108983517 A | 12/2018 |
| CN | 110174787 A | 8/2019 |
| CN | 110646994 A | 1/2020 |
| TW | 200938924 A | 9/2009 |

* cited by examiner

ARRAY SUBSTRATE AND DISPLAY PANEL

BACKGROUND OF INVENTION

Field of Invention

The present invention relates to the field of display, and more particularly, to an array substrate and a display panel.

Description of Prior Art

For vertical alignment (VA) type display panels, the birefraction difference of liquid crystal molecules at different viewing angles is higher, resulting in serious color shifting under wider viewing angles. Currently, multi-domain display modes are usually used in some liquid crystal displays with wide viewing angles to increase the viewing angle of the displays. Multi-domain display modes refer to the division of multiple areas in one sub-pixel, in which twisted angles of the liquid crystals in different areas are different. In comparison with traditional single-domain display modes, multi-domain display modes may reduce the contrast difference at different viewing angles, which is resulted from the same twisted angles of all liquid crystals in the pixels, thereby increasing the viewing angle. However, the existing liquid crystal displays with wide viewing angle have limited improvement in viewing angles, and cannot meet the increasing demands for wide viewing angles, such as electronic sports and virtual reality (VR) screens.

Therefore, there is an urgent need to provide a new display panel to solve the above problems.

SUMMARY OF INVENTION

The embodiments of the present invention provide an array substrate and a display panel for solving the technical problems that the existing display panels have narrow viewing angle and cannot meet the increasing demands for wide viewing angle.

The present invention provides an array substrate, comprising: a plurality of sub-pixels disposed on the substrate and arranged in array, in which each sub-pixel comprises a main area, a first sub-area, and a second sub-area;

a plurality of gate lines, in which each gate line is disposed in the sub-pixel in each row, and between the main area and the second sub-area;

a plurality of data lines and a plurality of divided voltage lines, in which each data line and each divided voltage line are disposed in the sub-pixel in each column, the two adjacent data lines define a pixel boundary, and the divided voltage line is disposed between two adjacent data lines; and a pixel electrode, in which the pixel electrode comprises a main pixel electrode disposed in the main area, a first sub-pixel electrode disposed in the first sub-area, and a second sub-pixel electrode disposed in the second sub-area.

The sub-pixel further comprises a first thin film transistor, a second thin film transistor, a third thin film transistor, and a fourth thin film transistor. The first thin film transistor is electrically connected to the first sub-pixel electrode, the second thin film transistor is electrically connected to the main pixel electrode, the third thin film transistor is electrically connected to the second sub-pixel electrode, and the fourth thin film transistor is electrically connected to the divided voltage line.

A channel aspect ratio of the second thin film transistor is greater than a channel aspect ratio of the first thin film transistor and a channel aspect ratio of the third thin film transistor.

In the array substrate of the present invention, the channel aspect ratio of the first thin film transistor is equal to the channel aspect ratio of the third thin film transistor.

In the array substrate of the present invention, the array substrate further comprises a common electrode, in which the common electrode and the gate line are disposed in a same layer, and the common electrode is disposed in the main area, the first sub-area, and the second sub-area.

In the sub-pixel of the array substrate of the present invention, a first electrical potential difference is formed between the main pixel electrode and the common electrode, a second electrical potential difference is formed between the first sub-pixel electrode and the common electrode, a third electrical potential difference is formed between the second sub-pixel electrode and the common electrode, the first electrical potential difference is greater than the third electrical potential difference, and the third electrical potential difference is greater than the second electrical potential difference.

In the array substrate of the present invention, the first thin film transistor has a gate electrically connected to the gate line, a source electrically connected to the data line, and a drain electrically connected to the first sub-pixel electrode, the common electrode, and a source of the third thin film transistor;

the second thin film transistor has a gate electrically connected to the gate line, a source electrically connected to the data line, and a drain electrically connected to the main pixel electrode and the common electrode;

the third thin film transistor has a gate electrically connected to the gate line, and a drain electrically connected to the second sub-pixel electrode, the common electrode, and a source of the fourth thin film transistor; and the fourth thin film transistor has a gate electrically connected to the gate line, and a drain electrically connected to the divided voltage line;

In the array substrate of the present invention, the sub-pixel further comprises: a main storage capacitor and a main liquid crystal capacitor disposed in the main area; a first sub-storage capacitor and a first sub-liquid crystal capacitor disposed in the first sub-area; and a second sub-storage capacitor and a second sub-liquid crystal capacitor disposed in the second sub-area.

In the array substrate of the present invention, the first thin film transistor has a gate electrically connected to the gate line, a source electrically connected to the data line, and a drain electrically connected to the first sub-pixel electrode and the common electrode;

the second thin film transistor has a gate electrically connected to the gate line, a source electrically connected to the data line, and a drain electrically connected to the main pixel electrode and the common electrode;

the third thin film transistor has a gate electrically connected to the gate line, a source electrically connected to the data line, and a drain electrically connected to the second sub-pixel electrode, the common electrode, and a source of the fourth thin film transistor; and the fourth thin film transistor has a gate electrically connected to the gate line, and a drain electrically connected to the divided voltage line.

In the array substrate of the present invention, the sub-pixel further comprises: a main storage capacitor and a main liquid crystal capacitor disposed in the main area; a first sub-storage capacitor and a first sub-liquid crystal capacitor disposed in the first sub-area; and a second sub-storage capacitor and a second sub-liquid crystal capacitor disposed in the second sub-area.

In the array substrate of the present invention, a first plate of the first sub-storage capacitor and a first plate of the first sub-liquid crystal capacitor are both electrically connected to the drain of the first thin film transistor, a second plate of the first sub-storage capacitor is electrically connected to the first sub-pixel electrode, and a second plate of the first sub-liquid crystal capacitor is electrically connected to the common electrode;

a first plate of the main storage capacitor and a first plate of the main liquid crystal capacitor are both electrically connected to the drain of the second thin film transistor, a second plate of the main storage capacitor is electrically connected to the main pixel electrode, and a second plate of the main liquid crystal capacitor is electrically connected to the common electrode; and a first plate of the second sub-storage capacitor and a first plate of the second sub-liquid crystal capacitor are both electrically connected to the drain of the third thin film transistor, a second plate of the second sub-storage capacitor is electrically connected to the second sub-pixel electrode, and a second plate of the second sub-liquid crystal capacitor is electrically connected to the common electrode.

In the array substrate of the present invention, the common electrode disposed in the main area, the first sub-area, and the second sub-area has a same electrical potential.

The present invention further provides a display panel, comprising the above-mentioned array substrate, a color filter substrate, and a liquid crystal layer disposed between the array substrate and the color filter substrate. The display panel comprises the plurality of sub-pixels arranged in array, and each main area, each first sub-area, and each second sub-area of the plurality of sub-pixels are connected to liquid crystal molecules of 4 domains.

The present invention further provides an array substrate, comprising: a plurality of sub-pixels disposed on the substrate and arranged in array, in which each sub-pixel comprises a main area, a first sub-area, and a second sub-area;

a plurality of gate lines, in which each gate line is disposed in the sub-pixel in each row, and between the main area and the second sub-area;

a plurality of data lines and a plurality of divided voltage lines, in which each data line and each divided voltage line are disposed in the sub-pixel in each column, the two adjacent data lines define a pixel boundary, and the divided voltage line is disposed between two adjacent data lines;

a pixel electrode, in which the pixel electrode comprises a main pixel electrode disposed in the main area, a first sub-pixel electrode disposed in the first sub-area, and a second sub-pixel electrode disposed in the second sub-area; and a common electrode, in which the common electrode and the gate line are disposed in a same layer, and the common electrode is disposed in the main area, the first sub-area, and the second sub-area.

The sub-pixel further comprises a first thin film transistor, a second thin film transistor, a third thin film transistor, and a fourth thin film transistor. The first thin film transistor is electrically connected to the first sub-pixel electrode, the second thin film transistor is electrically connected to the main pixel electrode, the third thin film transistor is electrically connected to the second sub-pixel electrode, and the fourth thin film transistor is electrically connected to the divided voltage line.

A channel aspect ratio of the second thin film transistor is greater than a channel aspect ratio of the first thin film transistor and a channel aspect ratio of the third thin film transistor, and the channel aspect ratio of the first thin film transistor is equal to the channel aspect ratio of third thin film transistor.

In the sub-pixel of the array substrate of the present invention, a first electrical potential difference is formed between the main pixel electrode and the common electrode, a second electrical potential difference is formed between the first sub-pixel electrode and the common electrode, a third electrical potential difference is formed between the second sub-pixel electrode and the common electrode, the first electrical potential difference is greater than the third electrical potential difference, and the third electrical potential difference is greater than the second electrical potential difference.

In the array substrate of the present invention, the first thin film transistor has a gate electrically connected to the gate line, a source electrically connected to the data line, and a drain electrically connected to the first sub-pixel electrode, the common electrode, and a source of the third thin film transistor;

the second thin film transistor has a gate electrically connected to the gate line, a source electrically connected to the data line, and a drain electrically connected to the main pixel electrode and the common electrode;

the third thin film transistor has a gate electrically connected to the gate line, and a drain electrically connected to the second sub-pixel electrode, the common electrode, and a source of the fourth thin film transistor; and the fourth thin film transistor has a gate electrically connected to the gate line, and a drain electrically connected to the divided voltage line;

In the array substrate of the present invention, the sub-pixel further comprises: a main storage capacitor and a main liquid crystal capacitor disposed in the main area; a first sub-storage capacitor and a first sub-liquid crystal capacitor disposed in the first sub-area; and a second sub-storage capacitor and a second sub-liquid crystal capacitor disposed in the second sub-area.

In the array substrate of the present invention, the first thin film transistor has a gate electrically connected to the gate line, a source electrically connected to the data line, and a drain electrically connected to the first sub-pixel electrode and the common electrode;

the second thin film transistor has a gate electrically connected to the gate line, a source electrically connected to the data line, and a drain electrically connected to the main pixel electrode and the common electrode;

the third thin film transistor has a gate electrically connected to the gate line, a source electrically connected to the data line, and a drain electrically connected to the second sub-pixel electrode, the common electrode, and a source of the fourth thin film transistor; and the fourth thin film transistor has a gate electrically connected to the gate line, and a drain electrically connected to the divided voltage line.

In the array substrate of the present invention, the sub-pixel further comprises: a main storage capacitor and a main liquid crystal capacitor disposed in the main area; a first sub-storage capacitor and a first sub-liquid crystal capacitor disposed in the first sub-area; and a second sub-storage capacitor and a second sub-liquid crystal capacitor disposed in the second sub-area.

In the array substrate of the present invention, a first plate of the first sub-storage capacitor and a first plate of the first sub-liquid crystal capacitor are both electrically connected to the drain of the first thin film transistor, a second plate of the first sub-storage capacitor is electrically connected to the first sub-pixel electrode, and a second plate of the first sub-liquid crystal capacitor is electrically connected to the common electrode;

a first plate of the main storage capacitor and a first plate of the main liquid crystal capacitor are both electrically connected to the drain of the second thin film transistor, a second plate of the main storage capacitor is electrically connected to the main pixel electrode, and a second plate of the main liquid crystal capacitor is electrically connected to the common electrode; and a first plate of the second sub-storage capacitor and a first plate of the second sub-liquid crystal capacitor are both electrically connected to the drain of the third thin film transistor, a second plate of the second sub-storage capacitor is electrically connected to the second sub-pixel electrode, and a second plate of the second sub-liquid crystal capacitor is electrically connected to the common electrode.

In the array substrate of the present invention, the common electrode disposed in the main area, the first sub-area, and the second sub-area has a same electrical potential.

The embodiments of the present invention provide an array substrate and a display panel, which comprise a pixel structure of 12 domains. Each sub-pixel comprises a main area, a first sub-area, a second sub-area, and four thin film transistors. The three display areas, i.e., the main area, the first sub-area, and the second sub-area, are driven by three thin film transistors. In the present invention, the channel aspect ratio of the thin film transistor which drives the main area is increased, and the drain of the fourth thin film transistor is electrically connected to the divided voltage line to divide the voltage of the second sub-area. Accordingly, the electrical potential differences in the main area, the first sub-area, and the second sub-area of the sub-pixel are different, such that the liquid crystal molecules of each domain have different twisted angles, and the display panel has a wider viewing angle.

BRIEF DESCRIPTION OF DRAWINGS

The technical solution and the beneficial effects of the present invention are best understood from the following detailed description with reference to the accompanying figures and embodiments.

DETAILED DESCRIPTION OF PREFERRED EMBODIMENTS

Figure 1:
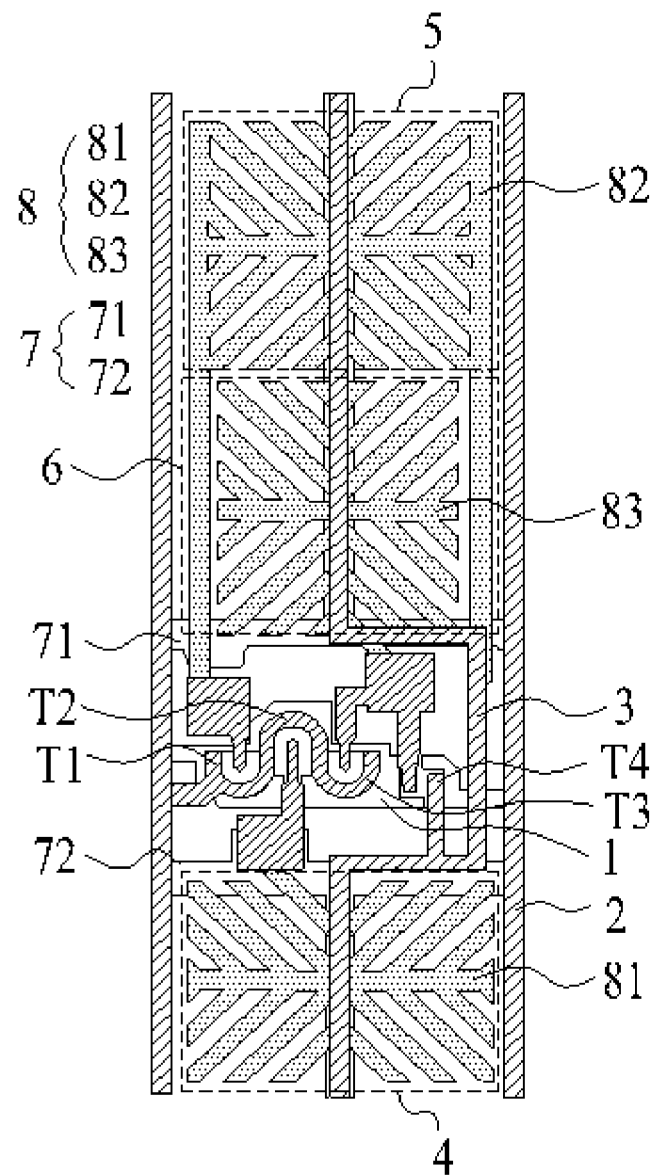
FIG. 1 is a schematic viewing of a structure of a pixel of an array substrate according to one embodiment of the present invention.

The technical solutions in the embodiments of the present invention are clearly illustrated in the following description with reference to the accompanying drawings of the embodiments of the present invention. It is obvious that the described embodiments are only a part of the embodiments of the present invention, rather than all of the embodiments. According to the embodiments of the present invention, the other embodiments obtained by a person skilled in the art without any creative effort fall within the scope of the present invention.

In the description of the present invention, it is to be understood that the terms such as "first" and "second" are merely used for descriptive purposes, rather than indicating or implying the relative importance or the number of the referred technical features. Furthermore, a feature defined by "first" or "second" may indicate or imply that one or more features are included. In the description of the present invention, "a plurality" means that the number is two or more than two, unless specifically defined otherwise.

The following disclosure provides many different embodiments or examples for implementing different structures of the present invention. Specific examples of components and arrangements are described below to simplify the disclosure of the present invention. These are, of course, merely examples and are not intended to be limiting. In addition, the present invention may repeat reference numerals and/or letters in the various examples. This repetition is for the purpose of simplicity and clarity and does not in itself dictate a relationship between the various embodiments and/or configurations discussed.

Specifically, FIG. 1 shows a schematic view of a structure of a pixel of an array substrate according to one embodiment of the present invention. The array substrate of the present invention comprises a plurality of sub-pixels disposed on the substrate and arranged in array. Only one sub-pixel is shown in FIG. 1 for illustration, and it should be understood that other sub-pixels have the same structure to such sub-pixel shown in FIG. 1.

The array substrate comprises a plurality of gate lines 1, a plurality of data lines 2, and a plurality of divided voltage lines 3. Each gate line 1 is disposed in the sub-pixel in each row, and each data line 2 and each divided voltage line 3 are disposed in the sub-pixel in each column. The two adjacent data lines 2 define a pixel boundary. The divided voltage line 3 is disposed between two adjacent data lines 2. The sub-pixel comprises a main area 4 (i.e., a main display area), a first sub-area 5 (i.e., a first display area), and a second sub-area 6 (i.e., a second display area), and the gate line 1 is disposed between the main area 4 and the second sub-area 6.

The array substrate further comprises a common electrode 7, in which the common electrode 7 and the gate line 1 are disposed in a same layer. The common electrode 7 comprises a main common electrode 71 disposed in the main area 4, and a sub-common electrode 72 disposed in the first sub-area 5 and the second sub-area 6. The common electrode 7 may be a transparent electrode, such as indium tin oxide and indium gallium tin oxide, which is not limited here.

In other embodiments, the common electrode 7 comprises a first sub-common electrode and a second sub-common electrode disposed in the first sub-area 5 and the second sub-area 6, respectively.

The array substrate further comprises a pixel electrode 8. The pixel electrode 8 comprises a main pixel electrode 81 disposed in the main area 4, a first sub-pixel electrode 82 disposed in the first sub-area 5, and a second sub-pixel electrode 83 disposed in the second sub-area 6. The pixel electrode 8 may be a transparent electrode, such indium tin oxide and indium gallium tin oxide, which is not limited here.

In one embodiment, the pixel electrode 8 has a herringbone- or union jack-shaped structure.

In the sub-pixel, a first electrical potential difference is formed between the main pixel electrode 81 and the main common electrode 71, a second electrical potential difference is formed between the first sub-pixel electrode 82 and the sub-common electrode 72, and a third electrical potential difference is formed between the second sub-pixel electrode 83 and the sub-common electrode 72. The common electrode 7 disposed in the main area 4, the first sub-area 5, and the second sub-area 6 has the same electrical potential.

The sub-pixel further comprises a first thin film transistor T1, a second thin film transistor T2, a third thin film transistor T3, and a fourth thin film transistor T4, which are disposed between the main area 4 and the second sub-area 6. The first thin film transistor T1 has a drain electrically connected to the first sub-pixel electrode 82 through a via hole. The second thin film transistor T2 has a drain electrically connected to the main pixel electrode 81 through a via hole. The third thin film transistor T3 has a drain electrically connected to the second sub-pixel electrode 83 through a via hole. The fourth thin film transistor T4 has a drain electrically connected to the divided voltage line 3.

The data line 2 charges the three display areas of the sub-pixel through the first thin film transistor T1, the second thin film transistor T2, and the third thin film transistor T3, respectively. The second thin film transistor T2 has a channel aspect ratio (W/L) greater than a channel aspect ratio of the first thin film transistor T1 and a channel aspect ratio of the third thin film transistor T3. That is to say, the channel aspect ratio of the second thin film transistor T2 is greatest, such that its charging ability is the strongest. Accordingly, the main area 4 has the greatest pixel voltage. The channel aspect ratio of the first thin film transistor T1 and the channel aspect ratio of the third thin film transistor T3 are the same; meanwhile, the electrical potential of the second sub-pixel electrode 83 disposed in the second sub-area 6 is divided by the fourth thin film transistor T4 onto the divided voltage line 3, such that the pixel voltage of the second sub-area 6 is lower than the pixel voltage of the first sub-area 5.

Therefore, in the sub-pixel, the main area 4, the first sub-area 5, and the second sub-area 6 have different pixel voltages, in which the first electrical potential difference is greater than the third electrical potential difference, and the third electrical potential difference is greater than the second electrical potential difference. Accordingly, the liquid crystal molecules connected to the main area 4, the first sub-area 5, and the second sub-area 6 have different twisted angles. Further, since each main area 4, each first sub-area 5, and each second sub-area 6 are individually connected to 4 domains, the liquid crystal molecules of 4 domains have different twisted angles, and the display panel has a wider viewing angle.

Figure 2:
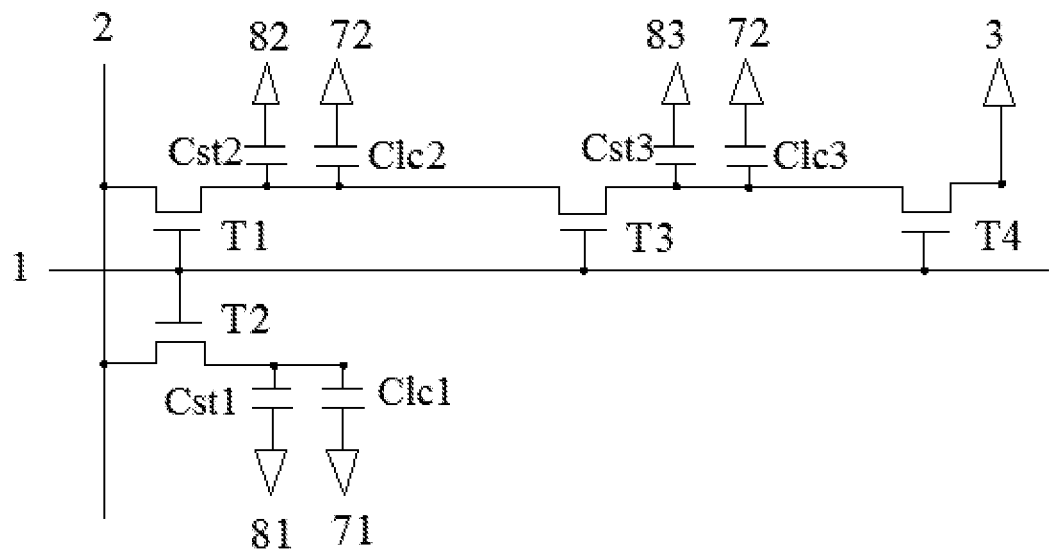
FIG. 2 is an equivalent circuit diagram of a pixel according to one embodiment of the present invention.

Also referring to FIG. 2, an equivalent circuit diagram of a pixel according to one embodiment of the present invention is shown. Only one sub-pixel is shown in FIG. 2 for illustration. The sub-pixel comprises a first thin film transistor T1, a second thin film transistor T2, a third thin film transistor T3, and a fourth thin film transistor T4.

The first thin film transistor T1 has a gate electrically connected to the gate line 1, a source electrically connected to the data line 2, and a drain electrically connected to the first sub-pixel electrode 82, the sub-common electrode 72, and a source of the third thin film transistor T3.

The second thin film transistor T2 has a gate electrically connected to the gate line 1, a source electrically connected to the data line 2, and a drain electrically connected to the main pixel electrode 81 and the main common electrode 71.

The third thin film transistor T3 has a gate electrically connected to the gate line 1, and a drain electrically connected to the second sub-pixel electrode 83, the sub-common electrode 72, and a source of the fourth thin film transistor T4.

The fourth thin film transistor T4 has a gate electrically connected to the gate line 1, and a drain electrically connected to the divided voltage line 3.

The sub-pixel further comprises: a main storage capacitor Cst1 and a main liquid crystal capacitor Clc1, which are disposed in the main area 4; a first sub-storage capacitor Cst2 and a first sub-liquid crystal capacitor Clc2, which are disposed in the first sub-area 5; and a second sub-storage capacitor Cst3 and a second sub-liquid crystal capacitor Clc3, which are disposed in the second sub-area 6.

A first plate of the main storage capacitor Cst1 and a first plate of the main liquid crystal capacitor Clc1 are both electrically connected to the drain of the second thin film transistor T2. A second plate of the main storage capacitor Cst1 is electrically connected to the main pixel electrode 81. A second plate of the main liquid crystal capacitor Clc1 is electrically connected to the main common electrode 71.

A first plate of the first sub-storage capacitor Cst2 and a first plate of the first sub-liquid crystal capacitor Clc2 are both electrically connected to the drain of the first thin film transistor T1. A second plate of the first sub-storage capacitor Cst2 is electrically connected to the first sub-pixel electrode 82. A second plate of the first sub-liquid crystal capacitor Clc2 is electrically connected to the sub-common electrode 72.

A first plate of the second sub-storage capacitor Cst3 and a first plate of the second sub-liquid crystal capacitor Clc3 are both electrically connected to the drain of the third thin film transistor T3. A second plate of the second sub-storage capacitor Cst3 is electrically connected to the second sub-pixel electrode 83. A second plate of the second sub-liquid crystal capacitor Clc3 is electrically connected to the sub-common electrode 72.

Figure 3:
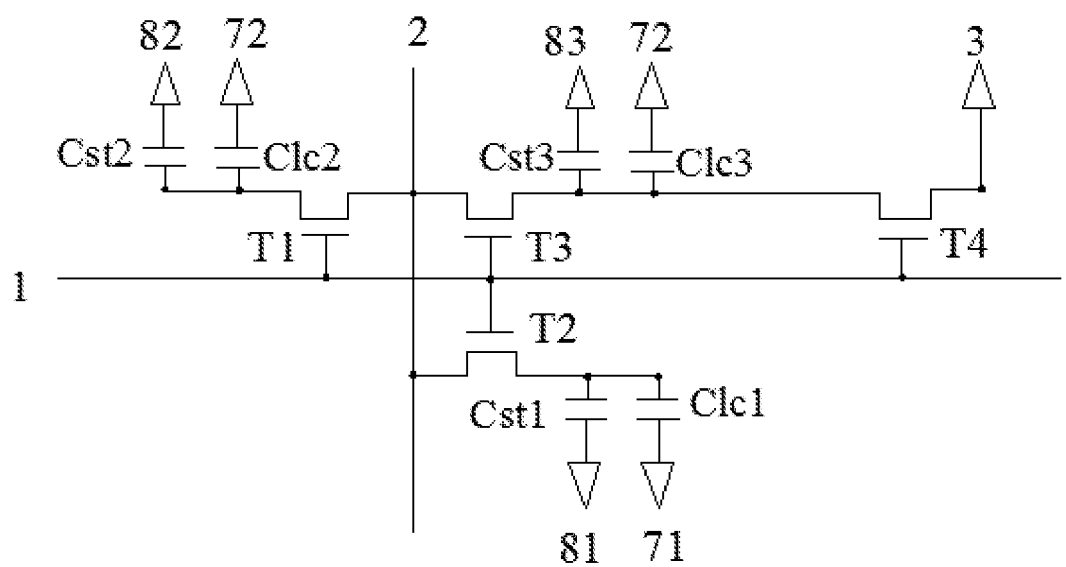
FIG. 3 is an equivalent circuit diagram of a pixel according to another embodiment of the present invention.

Also referring to FIG. 3, an equivalent circuit diagram of a pixel according to another embodiment of the present invention is shown. Only one sub-pixel is shown in FIG. 3 for illustration.

In the first thin film transistor T1, the gate is electrically connected to the gate line 1, the source is electrically connected to the data line 2, and the drain is electrically connected to the first sub-pixel electrode 82 and the sub-common electrode 72.

In the second thin film transistor T2, the gate is electrically connected to the gate line 1, the source is electrically connected to the data line 2, and the drain is electrically connected to the main pixel electrode 81 and the main common electrode 71.

In the third thin film transistor T3, the gate is electrically connected to the gate line 1, the source is electrically connected to the data line 2, and the drain is electrically connected to the second sub-pixel electrode 83, the sub-common electrode 72, and the source of the fourth thin film transistor T4.

In the fourth thin film transistor T4, the gate is electrically connected to the gate line 1, and the drain is electrically connected to the divided voltage line 3.

The sub-pixel further comprises the main storage capacitor Cst1 and the main liquid crystal capacitor Clc1 disposed in the main area 4, the first sub-storage capacitor Cst2 and the first sub-liquid crystal capacitor Clc2 disposed in the first sub-area 5, and the second sub-storage capacitor Cst3 and the second sub-liquid crystal capacitor Clc3 disposed in the second sub-area 6.

The first plate of the main storage capacitor Cst1 and the first plate of the main liquid crystal capacitor Clc1 are both electrically connected to the drain of the second thin film transistor T2. The second plate of the main storage capacitor Cst1 is electrically connected to the main pixel electrode 81. The second plate of the main liquid crystal capacitor Clc1 is electrically connected to the main common electrode 71.

The first plate of the first sub-storage capacitor Cst2 and the first plate of the first sub-liquid crystal capacitor Clc2 are both electrically connected to the drain of the first thin film transistor T1. The second plate of the first sub-storage capacitor Cst2 is electrically connected to the first sub-pixel electrode 82. The second plate of the first sub-liquid crystal capacitor Clc2 is electrically connected to the sub-common electrode 72.

The first plate of the first second sub-storage capacitor Cst3 and the first plate of the second sub-liquid crystal capacitor Clc3 are both electrically connected to the drain of the third thin film transistor T3. The second plate of the second sub-storage capacitor Cst3 is electrically connected to the second sub-pixel electrode 83. The second plate of the second sub-liquid crystal capacitor Clc3 is electrically connected to the sub-common electrode 72.

In the present invention, the data line 2 charges the three display areas of the sub-pixel through the first thin film transistor T1, the second thin film transistor T2, and the third thin film transistor T3, respectively. The channel aspect ratio of the second thin film transistor T2 is greatest, such that its charging ability is the strongest. Accordingly, the main area 4 has the greatest pixel voltage. The channel aspect ratio of the first thin film transistor T1 and the channel aspect ratio of the third thin film transistor T3 are the same; meanwhile, the electrical potential of the second sub-pixel electrode 83 disposed in the second sub-area 6 is divided by the fourth thin film transistor T4 onto the divided voltage line 3, such that the pixel voltage of the second sub-area 6 is lower than the pixel voltage of the first sub-area 5. Therefore, in the sub-pixel, the main area 4, the first sub-area 5, and the second sub-area 6 have different pixel voltages. Further, the main area 4, the first sub-area 5, and the second sub-area 6 are individually connected to 4 domains, such that the liquid crystal molecules of 4 domains have different twisted angles, and the display panel has a wider viewing angle.

The present invention further provides a display panel, comprising the above-mentioned array substrate, a color filter substrate, and a liquid crystal layer disposed between the array substrate and the color filter substrate. The display panel comprises a plurality of sub-pixels arranged in array. Each main area, each first sub-area, and each second sub-area are connected to liquid crystal molecules of 4 domains. For the structure of pixel of the display panel, please refer to the above descriptions of the array substrate, which is not further discussed here.

Detailed above is an array substrate and a display panel according to the embodiments of the present invention. Although the principle and implementation of the present invention are described with reference to exemplary embodiments, the embodiments are only intended to help understand the technical solution and core idea of the present invention. In addition, those skilled in the art shall understand that they may still make modifications to the technical solutions described in the foregoing embodiments or make equivalent replacements to some or all technical features thereof, without departing from the scope of the technical solutions of the embodiments of the present invention.

What is claimed is:

1. An array substrate, comprising:
   a plurality of sub-pixels disposed on the substrate and arranged in an array, wherein each sub-pixel comprises a main area, a first sub-area, and a second sub-area;
   a plurality of gate lines, wherein each gate line is disposed in the sub-pixel in each row, and between the main area and the second sub-area;
   a plurality of data lines and a plurality of divided voltage lines, wherein each data line and each divided voltage line are disposed in the sub-pixel in each column, the two adjacent data lines define a pixel boundary, and the divided voltage line is disposed between two adjacent data lines; and
   a pixel electrode, wherein the pixel electrode comprises a main pixel electrode disposed in the main area, a first sub-pixel electrode disposed in the first sub-area, and a second sub-pixel electrode disposed in the second sub-area;
   wherein the sub-pixel further comprises a first thin film transistor, a second thin film transistor, a third thin film transistor, and a fourth thin film transistor, the first thin film transistor is electrically connected to the first sub-pixel electrode, the second thin film transistor is electrically connected to the main pixel electrode, the third thin film transistor is electrically connected to the second sub-pixel electrode, and the fourth thin film transistor is electrically connected to the divided voltage line; and
   wherein a channel aspect ratio of the second thin film transistor is greater than a channel aspect ratio of the first thin film transistor and a channel aspect ratio of the third thin film transistor.

2. The array substrate according to claim 1, wherein the channel aspect ratio of the first thin film transistor is equal to the channel aspect ratio of third thin film transistor.

3. The array substrate according to claim 1, further comprising a common electrode, wherein the common electrode and the gate line are disposed in a same layer, and the common electrode is disposed in the main area, the first sub-area, and the second sub-area.

4. The array substrate according to claim 3, wherein in the sub-pixel, a first electrical potential difference is formed between the main pixel electrode and the common electrode, a second electrical potential difference is formed between the first sub-pixel electrode and the common electrode, a third electrical potential difference is formed between the second sub-pixel electrode and the common electrode, the first electrical potential difference is greater than the third electrical potential difference, and the third electrical potential difference is greater than the second electrical potential difference.

5. The array substrate according to claim 3, wherein
   the first thin film transistor has a gate electrically connected to the gate line, a source electrically connected to the data line, and a drain electrically connected to the first sub-pixel electrode, the common electrode, and a source of the third thin film transistor;
   the second thin film transistor has a gate electrically connected to the gate line, a source electrically connected to the data line, and a drain electrically connected to the main pixel electrode and the common electrode;
   the third thin film transistor has a gate electrically connected to the gate line, and drain electrically connected to the second sub-pixel electrode, the common electrode, and a source of the fourth thin film transistor; and
   the fourth thin film transistor has a gate electrically connected to the gate line, and a drain electrically connected to the divided voltage line.

6. The array substrate according to claim 5, wherein the sub-pixel further comprises:

a main storage capacitor and a main liquid crystal capacitor disposed in the main area;
a first sub-storage capacitor and a first sub-liquid crystal capacitor disposed in the first sub-area; and
a second sub-storage capacitor and a second sub-liquid crystal capacitor disposed in the second sub-area.

7. The array substrate according to claim 3, wherein
the first thin film transistor has a gate electrically connected to the gate line, a source electrically connected to the data line, and a drain electrically connected to the first sub-pixel electrode and the common electrode;
the second thin film transistor has a gate electrically connected to the gate line, a source electrically connected to the data line, and a drain electrically connected to the main pixel electrode and the common electrode;
the third thin film transistor has a gate electrically connected to the gate line, a source electrically connected to the data line, and a drain electrically connected to the second sub-pixel electrode, the common electrode, and a source of the fourth thin film transistor; and
the fourth thin film transistor has a gate electrically connected to the gate line, and a drain electrically connected to the divided voltage line.

8. The array substrate according to claim 7, wherein the sub-pixel further comprises:
a main storage capacitor and a main liquid crystal capacitor disposed in the main area;
a first sub-storage capacitor and a first sub-liquid crystal capacitor disposed in the first sub-area; and
a second sub-storage capacitor and a second sub-liquid crystal capacitor disposed in the second sub-area.

9. The array substrate according to claim 8, wherein
a first plate of the first sub-storage capacitor and a first plate of the first sub-liquid crystal capacitor are both electrically connected to the drain of the first thin film transistor, a second plate of the first sub-storage capacitor is electrically connected to the first sub-pixel electrode, and a second plate of the first sub-liquid crystal capacitor is electrically connected to the common electrode;
a first plate of the main storage capacitor and a first plate of the main liquid crystal capacitor are both electrically connected to the drain of the second thin film transistor, a second plate of the main storage capacitor is electrically connected to the main pixel electrode, and a second plate of the main liquid crystal capacitor is electrically connected to the common electrode; and
a first plate of the second sub-storage capacitor and a first plate of the second sub-liquid crystal capacitor are both electrically connected to the drain of the third thin film transistor, a second plate of the second sub-storage capacitor is electrically connected to the second sub-pixel electrode, and a second plate of the second sub-liquid crystal capacitor is electrically connected to the common electrode.

10. The array substrate according to claim 3, wherein the common electrode disposed in the main area, the first sub-area, and the second sub-area has a same electrical potential.

11. A display panel, comprising the array substrate according to claim 1, a color filter substrate, and a liquid crystal layer disposed between the array substrate and the color filter substrate, wherein in the plurality of sub-pixels arranged in array, each main area, each first sub-area, and each second sub-area are connected to liquid crystal molecules of 4 domains.

12. An array substrate, comprising:
a plurality of sub-pixels disposed on the substrate and arranged in array, wherein each sub-pixel comprises a main area, a first sub-area, and a second sub-area,
a plurality of gate lines, wherein each gate line is disposed in the sub-pixel in each row, and between the main area and the second sub-area;
a plurality of data lines and a plurality of divided voltage lines, wherein each data line and each divided voltage line are disposed in the sub-pixel in each column, the two adjacent data lines define a pixel boundary, and the divided voltage line is disposed between two adjacent data lines;
a pixel electrode, wherein the pixel electrode comprises a main pixel electrode disposed in the main area, a first sub-pixel electrode disposed in the first sub-area, and a second sub-pixel electrode disposed in the second sub-area; and
a common electrode, wherein the common electrode and the gate line are disposed in a same layer, and the common electrode is disposed in the main area, the first sub-area, and the second sub-area;
wherein the sub-pixel further comprises a first thin film transistor, a second thin film transistor, a third thin film transistor, and a fourth thin film transistor, the first thin film transistor is electrically connected to the first sub-pixel electrode, the second thin film transistor is electrically connected to the main pixel electrode, the third thin film transistor is electrically connected to the second sub-pixel electrode, and the fourth thin film transistor is electrically connected to the divided voltage line; and
wherein a channel aspect ratio of the second thin film transistor is greater than a channel aspect ratio of the first thin film transistor and a channel aspect ratio third thin film transistor, and the channel aspect ratio of the first thin film transistor is equal to the channel aspect ratio of the third thin film transistor.

13. The array substrate according to claim 12, wherein in the sub-pixel, a first electrical potential difference is formed between the main pixel electrode and the common electrode, a second electrical potential difference is formed between the first sub-pixel electrode and the common electrode, a third electrical potential difference is formed between the second sub-pixel electrode and the common electrode, the first electrical potential difference is greater than the third electrical potential difference, and the third electrical potential difference is greater than the second electrical potential difference.

14. The array substrate according to claim 12, wherein
the first thin film transistor has a gate electrically connected to the gate line, a source electrically connected to the data line, and a drain electrically connected to the first sub-pixel electrode, the common electrode, and a source of the third thin film transistor;
the second thin film transistor has a gate electrically connected to the gate line, a source electrically connected to the data line, and a drain electrically connected to the main pixel electrode and the common electrode;
the third thin film transistor has a gate electrically connected to the gate line, and drain electrically connected to the second sub-pixel electrode, the common electrode, and a source of the fourth thin film transistor; and
the fourth thin film transistor has a gate electrically connected to the gate line, and a drain electrically connected to the divided voltage line.

15. The array substrate according to claim 14, wherein the sub-pixel further comprises:
  a main storage capacitor and a main liquid crystal capacitor disposed in the main area;
  a first sub-storage capacitor and a first sub-liquid crystal capacitor disposed in the first sub-area; and
  a second sub-storage capacitor and a second sub-liquid crystal capacitor disposed in the second sub-area.

16. The array substrate according to claim 12, wherein
  the first thin film transistor has a gate electrically connected to the gate line, a source electrically connected to the data line, and a drain electrically connected to the first sub-pixel electrode and the common electrode;
  the second thin film transistor has a gate electrically connected to the gate line, a source electrically connected to the data line, and a drain electrically connected to the main pixel electrode and the common electrode;
  the third thin film transistor has a gate electrically connected to the gate line, a source electrically connected to the data line, and a drain electrically connected to the second sub-pixel electrode, the common electrode, and a source of the fourth thin film transistor; and
  the fourth thin film transistor has a gate electrically connected to the gate line, and a drain electrically connected to the divided voltage line.

17. The array substrate according to claim 16, wherein the sub-pixel further comprises:
  a main storage capacitor and a main liquid crystal capacitor disposed in the main area;
  a first sub-storage capacitor and a first sub-liquid crystal capacitor disposed in the first sub-area; and
  a second sub-storage capacitor and a second sub-liquid crystal capacitor disposed in the second sub-area.

18. The array substrate according to claim 17, wherein
  a first plate of the first sub-storage capacitor and a first plate of the first sub-liquid crystal capacitor are both electrically connected to the drain of the first thin film transistor, a second plate of the first sub-storage capacitor is electrically connected to the first sub-pixel electrode, and a second plate of the first sub-liquid crystal capacitor is electrically connected to the common electrode;
  a first plate of the main storage capacitor and a first plate of the main liquid crystal capacitor are both electrically connected to the drain of the second thin film transistor, a second plate of the main storage capacitor is electrically connected to the main pixel electrode, and a second plate of the main liquid crystal capacitor is electrically connected to the common electrode; and
  a first plate of the second sub-storage capacitor and a first plate of the second sub-liquid crystal capacitor are both electrically connected to the drain of the third thin film transistor, a second plate of the second sub-storage capacitor is electrically connected to the second sub-pixel electrode, and a second plate of the second sub-liquid crystal capacitor is electrically connected to the common electrode.

19. The array substrate according to claim 12, wherein the common electrode disposed in the main area, the first sub-area, and the second sub-area has a same electrical potential.

* * * * *